United States Patent [19]

Kawai

[11] Patent Number: 4,972,237
[45] Date of Patent: Nov. 20, 1990

[54] METAL-SEMICONDUCTOR FIELD EFFECT TRANSISTOR DEVICE

[75] Inventor: Takahisa Kawai, Kawasaki, Japan

[73] Assignee: Fujitsu Limited, Kawasaki, Japan

[21] Appl. No.: 362,224

[22] Filed: Jun. 7, 1989

[30] Foreign Application Priority Data

Jun. 13, 1988 [JP] Japan .................. 63-145456

[51] Int. Cl.⁵ .................. H01L 29/48; H01L 29/56; H01L 29/64
[52] U.S. Cl. .................. 357/15; 357/22; 357/52
[58] Field of Search .................. 357/23.2, 15, 23.3, 357/23.4, 22 R, 22 A, 22 I, 16, 52, 23.14

[56] References Cited

U.S. PATENT DOCUMENTS

| 4,048,646 | 9/1977 | Ogawa et al. | 357/15 |
| 4,608,583 | 8/1986 | Curtice | 357/22 |
| 4,647,954 | 3/1987 | Graf et al. | 357/23.3 |
| 4,763,176 | 8/1988 | Ito | 357/15 |

FOREIGN PATENT DOCUMENTS

| 57-26473 | 2/1982 | Japan | 357/22 MD |
| 58-50780 | 3/1983 | Japan . | |
| 59-107564 | 6/1984 | Japan | 357/23.14 |
| 61-171171 | 8/1986 | Japan . | |

OTHER PUBLICATIONS

Muller & Kamins, Device Electronics for Integrated Circuits, 1986, Sec. Ed., pp. 157-158, Pub., John Wiley & Sons, (textbook).

Sze, Semiconductor Device Physics and Technology, 1985, pp. 181-182, Pub., John Wiley & Sons, (textbook).

Primary Examiner—William D. Larkins
Assistant Examiner—Don Monin
Attorney, Agent, or Firm—Staas & Halsey

[57] ABSTRACT

A metal-semiconductor field effect transistor device has an active layer formed on a first main surface of a semiconductor substrate with a first gate electrode provided on the active layer in Schottky contact therewith and source and drain electrodes provided on opposite sides of the first gate electrode and in ohmic contact with the active layer so as to define corresponding source and drain regions in the active layer with an active region of the active layer extending therebetween. A second gate electrode including first and second portions is provided in Schottky contact on the active layer, respectively on the exposed surface portion segments thereof intermediate the opposite sides of the first gate electrode and the respective drain and source electrodes associated with the first gate electrode. A constant bias voltage is applied to the second gate electrode portions to suppress development of depletion regions in the active layer, corresponding to the second gate electrode portions and resulting from corresponding surface potentials induced by the surface states as well as the Schottky contacts, thereby to minimize or eliminate the resulting depletion regions and the undesired effect thereof on the conductive channel in the active layer.

9 Claims, 3 Drawing Sheets

METAL-SEMICONDUCTOR FIELD EFFECT TRANSISTOR DEVICE

BACKGROUND OF THE INVENTION

The present invention generally relates to so-called metal-semiconductor field effect transistors (MESFET) having a gate electrode which makes a Schottky contact with a semiconductor layer underneath, and more particularly to a high power MESFET device for operation in a high frequency region.

A MESFET is a type of junction field effect transistor comprising a gate electrode, a source electrode and a drain electrode making contact with a semiconductor layer underneath, wherein the gate electrode makes a Schottky contact and the source and drain electrodes make ohmic contacts. Such a MESFET has a simple structure which is easily manufactured. Further, MESFET is suited for miniaturization as the gate length of such a device is easily decreased. A MESFET based on gallium arsenide (GaAs), which provides high electron mobility, is used for various high power devices for high frequency use as well as high speed integrated circuits in the field of microwave or satellite telecommunications.

In a typical MESFET structure, a semi-insulating semiconductor material such as intrinsic GaAs is used as a substrate and the GaAs substrate is doped to the n-type along its top surface to form an active layer in which a conductive channel is formed. On the active layer, there is provided a gate electrode so as to make Schottky contact therewith, and on opposite sides of the gate electrode, a source electrode and a drain electrode are provided so as to make ohmic contact with the active layer underneath. In such a MESFET structure, there is formed a depletion region in the active layer in correspondence to the gate electrode which limits the channel formed in the active layer. By applying a negative voltage to the gate electrode, the depletion region extends further into the active layer and the electrical current flowing through the channel from the drain electrode to the source electrode is reduced or shut down. By reducing the magnitude of the negative gate voltage or by applying a positive voltage to the gate electrode, on the other hand, the extension of the depletion region into the active layer is reduced and the channel in the active layer is extended. Responsive thereto, the electrical current flowing through the channel is increased.

In such a simple MESFET structure, there are formed additional depletion regions in the active layer, one in the surface part between the gate electrode and the source as well as one between the gate electrode and the drain electrode, as a result of the surface potential induced by the surface states. Such depletion regions also limit the dimensions of the channel in the active layer and as a result, the maximum electrical current flowing through the channel is limited. It should be noted that these additional depletion regions are not controlled as to the extension of each into the active layer, in contrast to the case of the depletion region formed underneath the gate electrode. Thus, the simple MESFET has a problem in that the maximum source-drain current is limited to a level lower than the level which the device is potentially capable of providing because of the additional depletion regions which result from surface states and tend to block, or pinch-off the conductive channel.

In order to avoid this problem, there is proposed a MESFET structure having a recessed gate in which a groove is provided in the active layer between the source electrode and the gate electrode by isotropic etching, and the gate electrode is provided on the bottom of the groove thus formed. By providing the gate electrode at a level substantially lower than the level of the source and drain electrodes on the surface of the substrate, the channel extending between the source electrode and drain electrode passes through a part of the active layer away from its surface and the deteriorative effect of the depletion region at the surface of the active layer is avoided. However, formation of the groove in the active layer by etching is undesirable as it is difficult to control the extent of etching exactly. Further, such a process complicates the manufacturing of the device. It should be noted that the etching of the groove determines the thickness of the active layer which is critical to the operation of the device, especially the drain current of the device which is determined by the channel.

Further, there is proposed another type of MESFET structure designed to avoid the deteriorative effect of the surface depletion region, as described in Japanese Laid-open Patent Application No. 58-50780, in which the surface of the active layer including the source, drain and gate electrodes is covered by an insulator layer and another electrode is provided on the insulator layer so as to cover the latter uniformly. Referring to FIG. 1 showing this prior art MESFET structure, the MESFET structure is formed on a substrate 1 of GaAs having a surface region 2 doped to the n-type. On the surface region 2, there are formed a pair of conductive layers 2a and 2b doped to the n+-type and an active layer 2c doped to the n-type. In correspondence to the layers 2a, 2b and 2c, metal electrodes 3a, 3b and 3c forming the source, drain and gate electrodes are deposited as usual. Further, an insulator layer 4 is deposited on the surface region 2 so as to cover the electrodes 3a–3c and the active layer 2c. Furthermore, an electrode 5 is deposited so as to cover the insulator layer 4. According to this prior art MESFET structure, a depletion region 6 caused by the surface states of the active layer 2c is compensated or eliminated by applying a positive voltage to the additional electrode 5. Thus, one can eliminate the unnecessary limitation of the channel in the active layer 2c and the maximum source-drain current is increased.

In this MESFET structure, however, there arises a problem in that a substantial junction capacitance appears between the gate electrode 3c and the electrode 5 as well as between the source or drain electrode 3a, 3b and the electrode 5 as a result of the use of the insulator 4. Any of these capacitances causes a decrease in the gain of the device particularly in the high frequency range and the high frequency operational characteristic of the MESFET is deteriorated accordingly. Further, the provision of such an insulator layer 4 tends to invite unstable operation of the device such as oscillation particularly when silica ($SiO_2$) or other oxide is used as the insulator layer 4. In such a case, oxygen in the $SiO_2$ layer 4 tends to penetrate into the GaAs active layer 2c and form a deep impurity level. Further, the provision of the insulator layer 4 is not easy, as compared to the case of silicon transistors, since the layer 4 cannot be formed by simple oxidation of the surface of the substrate. When the insulator layer 4 is formed by deposition of silicon nitride ($Si_3N_4$) which is another material commonly used for insulating layer, on the other hand, there is a problem of mechanical stress accumulated in the layer 4 particularly when the thickness of the layer 4 is increased. When the thickness of the layer 4 is decreased so as to decrease the mechanical stress, on the other hand, the capacitance between the various electrodes, as above-noted, is increased. Such an increase in capacitance, especially between the gate electrode 3c and the electrode 5, significantly deteriorates the operation of the MESFET in the high frequency region. In a commonly used $Si_3N_4$ layer of about 1000 Å thickness, there is accumulated a stress which is ten times as large as the stress caused in the corresponding $SiO_2$ layer. Further, the structure of FIG. 1 is inconvenient for connection of wiring conductors to the gate, source or drain electrodes as these electrodes are located underneath the electrode 5.

SUMMARY OF THE INVENTION

Accordingly, it is a general object of the present invention to provide a novel and useful metal-semiconductor field effect transistor device wherein the aforementioned problems are eliminated.

Another and more specific object of the present invention is to provide a high power metal-semiconductor field effect transistor device in which device-by-device fluctuation of the maximum current capable of flowing through the device is eliminated.

Another object of the present invention is to provide a high power metal-semiconductor field effect transistor device wherein any decrease of the gain in a high frequency range of operation is eliminated.

Another object of the present invention is to provide a metal-semiconductor field effect transistor having a high withstand voltage.

Another object of the present invention is to provide a metal-semiconductor field effect transistor device having a first gate electrode for application of an input signal to the device, provided on the surface of active layer a semiconductor substrate so as to make a Schottky contact therewith, and spaced between source and drain electrodes which are formed on the active surface layer in ohmic contact therewith, and accordingly on opposite sides of the first gate electrode. The source and drain electrodes respectively define source and drain regions in the active layer, beneath the corresponding electrodes and defining a conductive channel extending therebetween through the active layer and beneath the first gate electrode. To correct for the depletion regions resultant from the surface potential induced by the surface states of the active layer, in the portions thereof intermediate the first gate electrode and the source and drain electrodes, there is provided a second gate electrode comprising first and second gate electrode portions respectively disposed on the active surface intermediate the opposite sides of the first gate electrode and the source and drain electrodes, respectively. There is further provided biasing means for applying a biasing voltage to said first and second electrode portions such that depletion regions formed in the active layer underneath these first and second electrode portions are eliminated. According to the present invention, the uncontrolled depletion regions respectively formed in the active layer between the opposite sides of the first gate electrode and the source electrode and the drain electrode of the prior art devices, and which cause a decrease in the conductive channel, are effectively suppressed or eliminated. Thus, the device of the present invention permits a large source-drain current to flow in the conductive channel. Another feature of the device of the present invention is that the first and second gate electrode portions of the second gate electrode make direct contact with the active layer, similarly to the case of the first gate electrode. In other words, there is no insulator or dielectric layer between the active layer and the first and second gate electrode portions—in contrast to the case of the referenced prior art device, which employs an additional electrode and an intervening insulator layer for avoiding the deteriorating effect of the surface depletion region on the conductive channel. Thus, parasitic capacitances are not formed between the first electrode and the first and second electrode portions of the second gate electrode and the problem of the decrease in gain at a high frequency range of operation, as occurs in the referenced prior art device employing a further electrode, is successfully eliminated. Further, the device of the present invention provides a high withstand voltage, since a small positive voltage is applied to the portion of the second gate electrode which is interposed between the first gate electrode and the drain electrode, to the latter of which a large drain voltage is applied. Furthermore, the device of the present invention is suitable for being covered with a thin protective film. The parasitic capacitance introduced by use of the film decreases with decreasing thickness of the protective film and the device and, accordingly, a commonly used silicon nitride protective film of a thickness of about 1000 Å or less is particularly suitable for use with the device of the invention.

Other objects and further features of the present invention will become apparent from the following description for preferred embodiments when read in conjunction with attached drawings.

DETAILED DESCRIPTION

Figure 1:
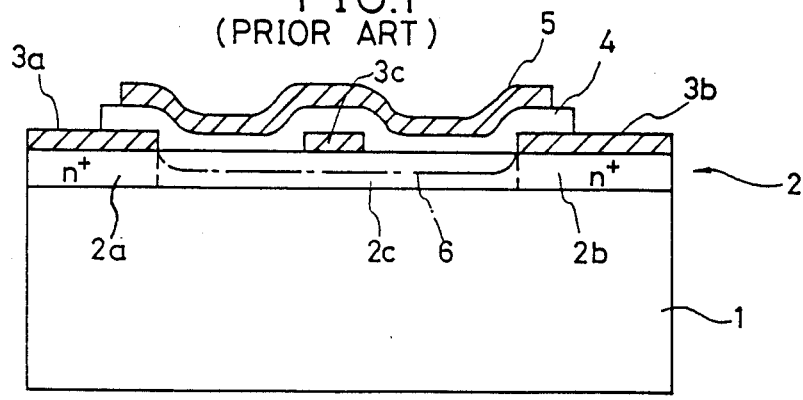
FIG. 1 is a cross sectional view showing a prior art MESFET device.
Figure 2:
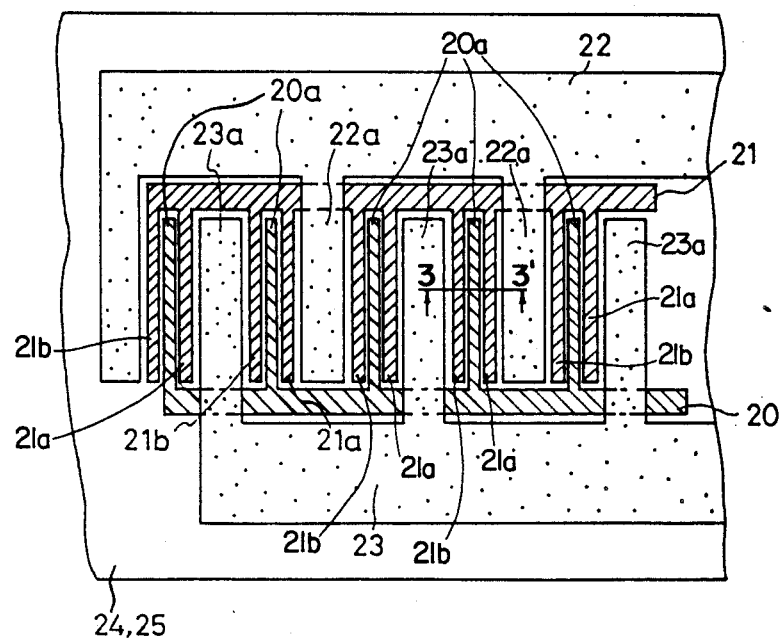
FIG. 2 is a plan view showing a first embodiment of the MESFET device of the present invention.
Figure 3:
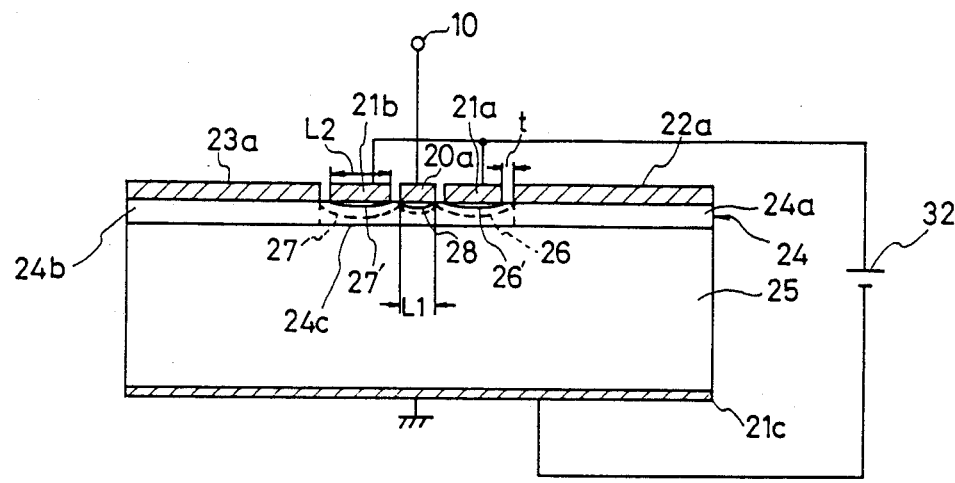
FIG. 3 is a cross sectional view showing a part of the device of FIG. 2.

FIG. 2 shows a plan view of the MESFET device of the present invention, and FIG. 3 shows a part of the device of FIG. 2 in cross section taken along a 3—3' line in FIG. 2. In the drawings, corresponding parts are given identical reference numerals.

Referring to FIG. 2, there is provided a comb shaped gate conductor 20 of a metal such as aluminium (Al) or tungsten silicide (WSi) on an n-type surface layer 24 formed on the top surface of an intrinsic type GaAs substrate 25 such that there is established a Schottky contact between the gate conductor 20 and the active layer 24. The gate conductor 20 has a shape similar to a comb and is branched into a plurality of gate electrodes 20a corresponding to the teeth of the comb. Further, a drain conductor 22, each and a source conductor 23 having a corresponding comb shape, are provided on the active layer 24 such that there are formed drain electrodes 22a and source electrodes 23a, as the teeth of the respective combs, so that drain and source electrodes 22a and 23a are located on an opposite sides of each primary, or first gate electrode 20a. The conductors 22 and 23 each form ohmic contacts with the active layer 24 underneath and each may comprise stacked layers of gold (Au), nickel (Ni) and Au (Au/Ni/Au structure) or stacked layers of Au, germanium (Ge) and Au (Au/Ge/Au structure). In correspondence to the portions of the conductors 22 and 23 respectively forming the drain and source electrodes 22a and 23a, conductive regions 24a and 24b of the n+-type (not shown in FIG. 2, see FIG. 3) are formed in the active layer 24 so that the electrodes 22a and 23a make ohmic contact therewith and correspondingly define the regions 24a and 24b as drain and source regions. Further, the portions of the source electrodes 23a crossing the gate conductor 20 form an airbridge structure, i.e., those portions of the electrodes 23a corresponding to intersections with the conductor 20 are lifted from the surface of the active layer 24 and pases above the gate conductor 20.

Further, there is provided an additional gate electrode structure comprising a conductor 21 having a corresponding comb shape on the active layer 24, the conductor 21 being split into plural pairs of additional gate electrodes 21a and 21b in correspondence to the teeth of a comb, the gate electrodes 21a and 21b of each pair extending on respective, opposite sides of the gate electrode 20a in the respective regions defined by and intermediate the associated source and drain electrodes 23a and 22a. This additional conductor 21 may be made of the same material as that of the conductor 20. Further, an airbridge structure similar to the one already described is also formed at each intersection between a drain electrode 22a and the conductor 21.

Referring now to the cross section of FIG. 3 taken along the 3—3' line FIG. 2 showing the MESFET device together with associated circuit parts also forming the device, it can be seen that the gate electrode 21a and the gate electrode 21b are disposed on the surface of the active layer 24 at a region between the drain electrode 22a and the source electrode 23a in a manner such that the gate electrode 21a and the gate electrode 21b extend along respective, opposite sides of the gate electrode 20a, for each such primary or first gate electrode 20a and its respectively associated, secondary gate electrodes 21a and 21b and drain and source electrodes 22a and 23a. Further, there are provided a conductive layer 24a and a conductive layer 24b, both doped to the n+-type, in the active layer 24 in correspondence respectively to the drain electrode 22a and the source electrode 23a and thus comprising drain and source regions 24a and 24b. As a result, an n-type active region 24c is left between the pair of conductive layers 24a and 24b and it is this region 24c that makes Schottky contact with the primary gate electrode 20a and the additional gate electrodes 21a and 21b.

In the illustrated example, the thickness of the active layer 24 is about 2000 Å and the gate length L1 of the primary gate electrode 20a forming the gate of the MESFET is set to about 0.2–0.5 μm. Further, each of the secondary, or additional gate electrodes 21a or 21b has a gate length of from about 1–5 μm. Further, the separation t between the electrodes 20a and 21a, 21a and 22a, 20a and 21b, and 21b and 23a is set to about 1–5 μm. In the drawing, the distance t is illustrated only for the gap between the gate electrode 21a and the source electrode 22a for avoiding the complexity of the drawing. In the present embodiment, the distance t is made identical for all of the above mentioned gaps. However, the present invention is not so limited but instead the distance t may be changed in each of the gaps. As is apparent, the specified dimensions (and ranges) of the electrodes and the spacing distance "t" are not necessarily illustrated to scale in FIG. 3. The thickness of the electrodes may be several microns.

From FIG. 3, it can be seen that the gate electrode 20a is connected to an input terminal 10 of the MESFET device. Further, there is provided another electrode 21c on the bottom surface of the substrate 25 and this electrode 21c is connected to ground. Further, there is provided a d.c. voltage source 32 having a plus (positive) terminal connected to the gate additional electrodes 21a and 21b and a minus (negative) terminal connected to the electrode 21c.

Next, the operation of the MESFET device of the present invention shown in FIG. 3 will be described. Referring to the drawing, it can be seen that there are depletion regions 26, 27 and 28 formed in the active region 24c in correspondence to the electrodes 21a, 21b and 20a respectively, in which the depletion region 28 under the gate electrode 20a is controlled so as to be responsive to a high frequency signal, i.e., a radio frequency signal applied to the input terminal 10 as illustrated by the depletion region 28 extending between solid and dotted line positions beneath the primary gate electrode 20a. On the other hand, the depletion regions 26 and 27 are formed as a result of the surface potential induced by the surface states as well as the Schottky contact between the additional gate electrodes 21a and 21b and the active region 24c and are not controlled by the input signal. Likewise, in the absence of an input signal at terminal 10, the extent of the depletion region 28 under primary gate electrode 20a is determined by the surface states and the Schottky contact, and would correspond substantially in its extent to that of the depletion regions 27 and 28 (dotted lines).

Thus, when the conductive layer or source region 24b underneath the source electrode 23a supplies electrons to the active region 24c and the conductive layer or drain region 24a collects the electrons with pass through the active region 24c along a channel formed therein, this conductive channel in the active layer 24 is narrowed by the extension of the depletion regions 26–28 into the active layer 24 and the source-drain current is decreased accordingly. As the depletion region 28 is controlled by the signal at the input terminal 10 and which thereby controls the source-drain current level, the depletion layer 28 is essential to the operation of the MESFET. On the other hand, the depletion regions 26 and 27 are not related to the operation of the device and act as unwanted obstacles to the electron flow in the channel.

In the MESFET device of the present invention, the extension of these unwanted depletion regions 26 and 27 is reduced by applying a suitable positive voltage to the gate electrodes 21a and 21b, as in the illustrated in FIG. 3 by connecting these electrodes to the plus terminal of the d.c. voltage source 32. In correspondence to the additional gate electrodes 21a and 21b, there is provided an opposing electrode 21c on the bottom surface of the substrate 25 to which the minus terminal of the voltage source 32 is connected.

By applying a biasing voltage of about +0.4 to +0.6 volts, which is substantially lower than the voltage usually applied to the drain electrode 22a (about 10 volts), to the additional gate electrodes 21a and 21b so as to compensate for the surface potential formed between each of these additional gate electrodes 21a and 21b and the respective drain and source electrodes 22a and 23a which is typically in the rage of −0.4 to −0.6 volts, one can reduce or eliminate the respective depletion regions 26 and 27, as is represented in FIG. 3 by the reduced depletion regions respectively identified by the; numerals 26' and 27'. As a result, the conductive channel is wide open and the MESFET can provide a large source-drain current.

Further, it should be noted that, as a result of application the of the small positive d.c. bias voltage of about +0.4 to 0.6 volts to the gate electrode 21a located between the gate electrode 20a and the drain electrode 22a, to the latter of which a large positive drain voltage is applied, the concentration of an electrical field at opposing edges of the gate electrode 21a and the drain electrode 22a is avoided. Thus, the damage to the electrodes due to the concentration of the electrical field is avoided and the withstand performance of the device is improved.

Figure 4:
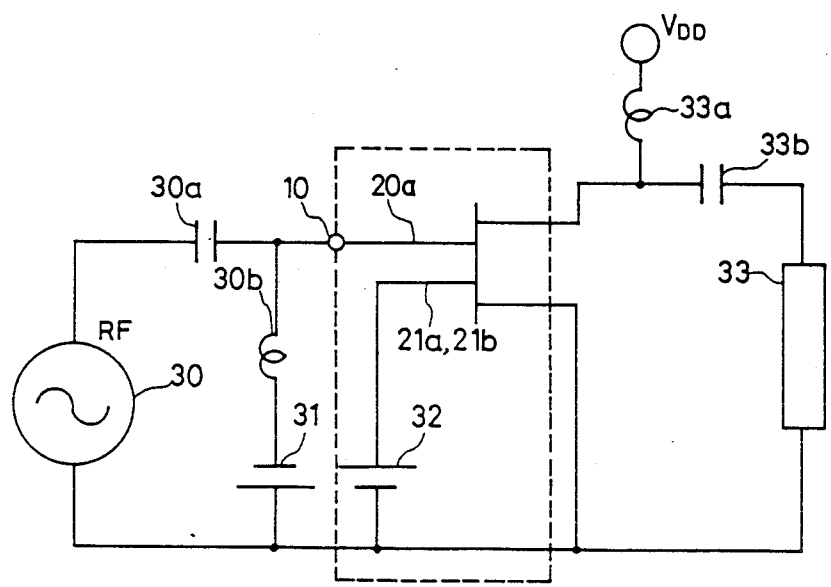
FIG. 4 is a circuit diagram showing an example of an application of the MESFET device of FIG. 2.

FIG. 4 shows an example of the use of the MESFET device of the present invention in which the MESFET device is used as an amplifying circuit operating in a radio frequency or microwave frequency range. Referring to the drawing, the MESFET device is supplied with an input r.f. signal at the input terminal 10 from a high frequency signal source 30 through a high pass filter circuit comprising a capacitor 30a and an inductor 30b and in a state such that the signal is biased with a negative d.c. voltage produced by a d.c. voltage source 31 having a minus terminal connected to the input terminal 10. Further, it can be seen that the d.c. voltage source 32 applies the positive d.c. bias of +0.4 to 0.6 volts to the additional gate electrodes 21a and 21b as already described so as to eliminate the depletion region underneath these electrodes. The MESFET is further supplied with drain voltage $V_{DD}$ through a choke coil 33a and operates as an amplifying device in which an output signal is supplied to a load 33, such as an antenna, via a capacitor 33b. As the unwanted depletion regions 26 and 27 in the channel region are eliminated by applying the compensating voltage to the additional gate electrodes 21a and 21b as already described, a large output power can be obtained at the load 33.

Figure 5:
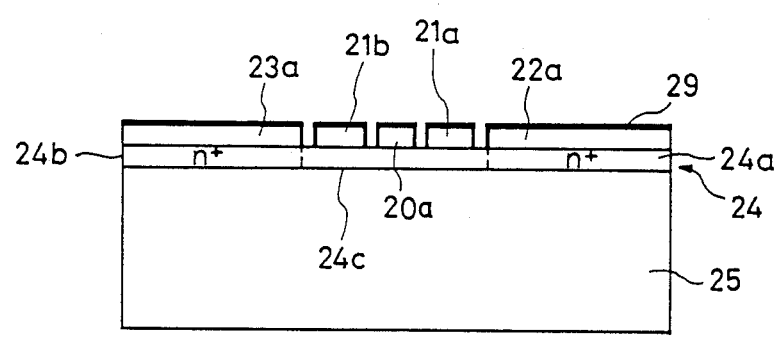
FIG. 5 is a cross sectional view similar to FIG. 3 showing a second embodiment of the MESFET device of the present invention.

FIG. 5 shows a second embodiment of the device of the present invention wherein a protective layer of silicon nitride 29 is provided so as to cover the entire surface of the structure of FIG. 3 including the electrodes 20, 21a, 21b, 22a and 23a as well as surface regions of the active layer 24 of the substrate 25 located between these electrodes. In the drawing, only essential parts are illustrated.

In this embodiment, the thickness of the protective layer should be as small as possible and preferably about 500-1000 Å or less which coincides with the thickness of silicon nitride film as is commonly used in a art for protecting the surface of the semiconductor material. As the increase in the thickness in such a silicon nitride layer invites the accumulation of mechanical stress as well as an increase in the junction capacitance, a very thin such silicon nitride layer is best suited for the MESFET structure of the present invention.

Further, the material for the substrate 25 is not limited to GaAs but indium gallium arsenide (InGaAs) may be used instead.

Further, the present invention is not limited to these embodiments specifically disclosed herein, various variations and modifications may be made without departing from the scope of the present invention.

What is claimed is:

1. A metal-semiconductor field effect transistor device, comprising:
    a semiconductor substrate having a main surface;
    an active layer formed at the main surface of the semiconductor substrate;
    source and drain electrodes formed on and in ohmic contact with the active layer and defining respective source and drain regions in the active layer, the source and drain electrodes being displaced in a first direction so as to define therebetween an exposed surface portion of the active layer and an active region of the active layer corresponding to the exposed surface portion thereof and extending in the first direction between the source and drain regions, the active region defining a controllable, conductive channel between the source and drain regions;
    a first gate electrode centrally disposed on the exposed surface of the active layer in Schottky contact therewith, the first gate electrode extending in a second direction, transverse to the first direction and thus to the conductive channel, and having substantially parallel, first and second edges respectively displaced from corresponding, opposed edges of the drain and source electrodes and thereby defining corresponding, first and second remaining segments of the exposed surface of the active layer;
    a second gate electrode comprising first and second portions on the respective, first and second remaining segments of the exposed surface of the active layer, extending in parallel relationship and respectively spaced from the respective first and second edges of the first gate electrode and the corresponding, opposed edges of the drain and source electrodes;
    each of the first gate electrode and the first and second portions of the second gate electrode having corresponding depletion regions associated therewith, extending into the active region of the active layer as a result of surface effects of the active layer and the respective Schottky contacts of the electrodes therewith;
    means for applying a constant voltage to the second gate electrode for suppressing the extension of the depletion regions corresponding thereto in the active region; and
    means for applying a variable input signal to the first gate electrode for correspondingly, variably controlling the extension of the corresponding depletion region associated therewith and correspondingly the level of conduction in the conductive channel.

2. A metal-semiconductor field effect transistor device as claimed in claim 1, wherein:
    said first means comprises a direct current voltage source for applying a direct current voltage to the second gate electrode; and
    the second means comprises an input terminal connected to the first gate electrode.

3. A metal-semiconductor field effect transistor device as claimed in claim 1, wherein the direct current voltage source supplies a selectively variable voltage in the range from +0.4 volts to +0.6 volts.

4. A metal-semiconductor field effect transistor device as claimed in claim 1, wherein the first means applies a radio frequency input signal.

5. A metal-semiconductor field effect transistor device as claimed in claim 4, wherein:
the semiconductor substrate comprises gallium arsenide; and
the second gate electrode comprises aluminum.

6. A metal-semiconductor field effect transistor device as claimed in claim 4, wherein:
the substrate comprises gallium arsenide; and
the second gate electrode comprises tungsten silicide.

7. A metal-semiconductor field effect transistor device as claimed in claim 1, wherein:
each portion of the second gate electrode has a gate length, measured in the first direction, which is at least twice as large as the corresponding gate length of the first gate electrode.

8. A metal-semiconductor field effect transistor device as claimed in claim 4, further comprising:
a protective insulating layer covering each of the electrodes and all remaining portions of the exposed surface of the active layer, the protective layer having a thickness of less than about 1000 Å.

9. A metal-semiconductor field effect transistor device as claimed in claim 8, wherein the insulator comprises silicon nitride.

* * * * *

UNITED STATES PATENT AND TRADEMARK OFFICE
CERTIFICATE OF CORRECTION

PATENT NO. : 4,972,237

DATED : Nov. 20, 1990

INVENTOR(S) : KAWAI

It is certified that error appears in the above-identified patent and that said Letters Patent is hereby corrected as shown below:

Col. 3, line 41, before "active" insert --an--.

Col. 4, line 68, after "22" delete ", each", and after "23" insert --, each--.

Col. 5, line 5, delete "an";
line 6, after "first" insert --,--;
line 23, change "pases" to --pass--;
line 40, after "line" insert --of--.

Col. 6, line 18, change "gate additional" to --additional gate--;
line 46, change "with" to --which--.

UNITED STATES PATENT AND TRADEMARK OFFICE
CERTIFICATE OF CORRECTION

Page 2 of 2

PATENT NO. : 4,972,237

DATED : Nov. 20, 1990

INVENTOR(S) : KAWAI

It is certified that error appears in the above-identified patent and that said Letters Patent is hereby corrected as shown below:

* Col. 7, line 8, change "rage" to --range--;
        line 12, delete ";";
        line 15, after "result of" insert --the--;
        line 16, delete "the" (first occurrence);
        line 38, change "0.6" to --+ 0.6--;
        line 63, change "a" to --the--, and change "the" (second occurrence) to --a--.

Col. 8, line 5, after "herein," insert --but--.

Signed and Sealed this

Fourth Day of August, 1992

Attest:

DOUGLAS B. COMER

*Attesting Officer*  *Acting Commissioner of Patents and Trademarks*